United States Patent [19]

Becker

[11] 4,209,757
[45] Jun. 24, 1980

[54] CIRCUIT FOR COMPENSATING HARMONIC CURRENTS IN AN ELECTRIC CONSUMER ARRANGEMENT

[75] Inventor: Michael Becker, Uttenreuth, Fed. Rep. of Germany

[73] Assignee: Siemens Aktiengesellschaft, Munich, Fed. Rep. of Germany

[21] Appl. No.: 891,917

[22] Filed: Mar. 30, 1978

[30] Foreign Application Priority Data

Apr. 12, 1977 [DE] Fed. Rep. of Germany ....... 2716153

[51] Int. Cl.$^2$ .................... H03H 7/10; H03H 7/24; H02J 1/02
[52] U.S. Cl. .................... 333/17 R; 307/105; 333/176; 333/180; 333/181
[58] Field of Search .............. 333/70 R, 76, 77, 78, 333/79, 12, 17 R, 20, 175–181; 307/105; 361/111, 113; 328/262, 167; 363/39, 47; 323/83, 61, 62, 45, 75 M; 322/76, 78, 32, 58

[56] References Cited

U.S. PATENT DOCUMENTS

| 2,825,024 | 2/1958 | Berghoff | 323/61 |
| 2,959,738 | 11/1960 | Nagai | 333/76 X |
| 3,351,849 | 11/1967 | Mesenhimer | 323/61 X |
| 3,435,331 | 3/1969 | Bixby | 323/62 X |

Primary Examiner—Alfred E. Smith
Assistant Examiner—Marvin Nussbaum
Attorney, Agent, or Firm—Kenyon & Kenyon

[57] ABSTRACT

To improve the effect of a filter circuit for the harmonics, which contains an L-C-R series resonant circuit in at least one loop, a variable supplementary current excitation which compensates the residual harmonic current in the consumer arrangement at least approximately, is coupled into the series resonant circuit, the supplementary current excitation preferably being supplied by a compensation transformer which is controlled by the current in the loop, the compensation transformer being excited by a source and controlled by an auxiliary transformer arranged in the loop.

2 Claims, 3 Drawing Figures

CIRCUIT FOR COMPENSATING HARMONIC CURRENTS IN AN ELECTRIC CONSUMER ARRANGEMENT

BACKGROUND OF THE INVENTION

This invention relates to compensating harmonics in general and more particularly to a circuit for compensating harmonics in an electric consumer arrangement, particularly high voltage d-c transmission systems.

Filter circuits for compensating harmonics which include an L-C-R series resonant circuit in at least one loop are known. In such circuits, such as are provided particularly for high voltage d-c transmission systems, undersirable harmonic currents can be transmitted to d-c consumer arrangements from the converter stations which are connected to the latter via high voltage d-c (HVDC) lines, unless these harmonics are removed from the HVDC lines by filter circuits. These harmonics must be avoided, for instance, because of interference with a connecting telephone line. For higher harmonics, this can generally be done successfully by means of appropriate highpass filters to a sufficiently high degree, but the difficulty of reliably reducing the line current in dependence on the temperature, for instance, for eliminating harmonic currents of low order (for instance, the 12th harmonic in 12-pulse groups) remains.

SUMMARY OF THE INVENTION

It is an object of the present invention to improve the filter effect by removing the harmonic current in the consumer arrangement (e.g., a d-c line).

The solution of the stated problem is possible through the use of a variably supplementary current excitation which is coupled into the series resonant circuit and which at least approximately compensates the residual harmonic current in the consumer arrangement. The supplementary current excitation is preferably supplied by a compensation transformer which is controlled by the current in the loop. The compensation transformer is excited by a source and controlled in response to an auxillary transformer arranged in the loop.

DETAILED DESCRIPTION OF THE INVENTION

Figure 1:
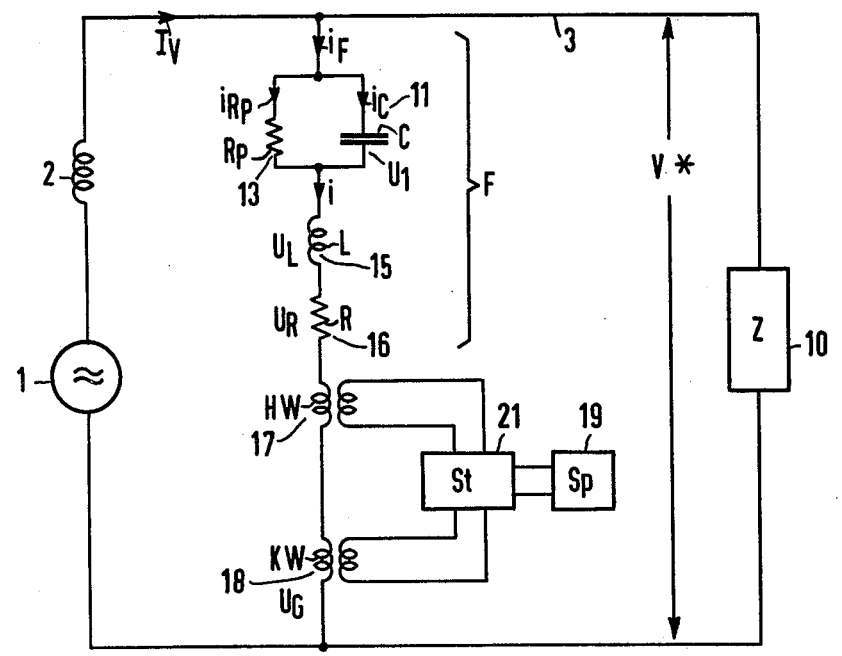
FIG. 1 is a block diagram of the compensation circuit of the present invention.

FIG. 1 shows a HVDC transmission system with a converter 1 followed by the smoothing choke 2, which feeds d-c current to a consumer arrangement 10 (load) via the HVDC lines 3. The line impedance, including the termination of the line at the substation, is indicated as Z. Also shown is a conventional prior art filter which includes a capacitor 11 of value C in parallel with a resistor 13 having a value of $R_p$. This parallel circuit is in series with an inductance 15 having a value L and a resistance 16 having a value R. Also, in accordance with the present invention, in series with this connection is a first transformer 17 and a second transformer 18. The transformer 17 is a transformer used for measuring the current and the transformer 18, a transformer for providing supplementary current excitation. Transformer 18 is supplied from a source 19 through a control circuit 21 which receives a controlling input from the transformer 17. If F is understood to be the resultant impedance of the filter circuit under consideration, we have the relation $V=I_F \cdot F=I_Z \cdot Z$, where $I_F$ and $I_Z$ are the currents in the filter circuit and the overall consumer arrangement, respectively. These currents add up vectorially to form the sum current $I_V$ which is supplied by the converter 1.

If the impedances are assumed to be in-phase, we have $I_F \cdot F = I_Z \cdot Z$, from which follows $I_Z = I_V/(1 = Z/F)$. $I_Z$ goes toward zero if $Z >> F$.

Figure 2:
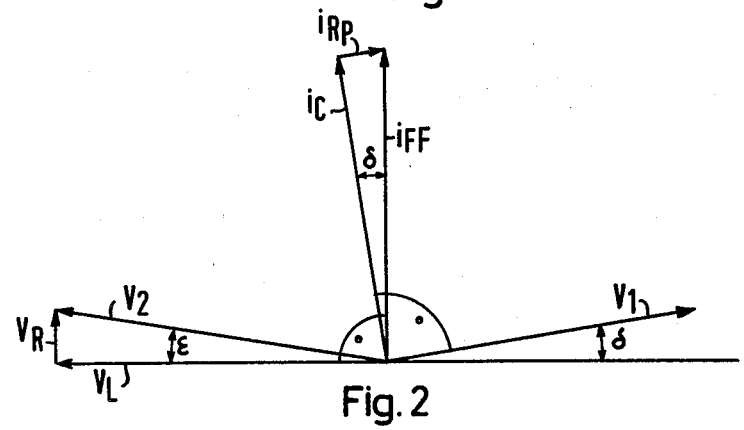
FIGS. 2 and 3 are vector diagrams of the voltage and currents in the filter circuit for a single harmonic.

For the filter shown, up to the 12th harmonic, one obtains the current and voltage distribution indicated in FIG. 1; the current $i_F$ in the filter circuit is divided into $i_{Rp}$ and $I_C$, i.e., partial currents flow through a capacitor 11 and its shunt resistor 13, causing a voltage drop $V_1$. The combined current $i_F$ produces a voltage drop $V_L$ in the series inductance 15 and a voltage drop $V_R$ in the series resistance 11; $V_L$ and $V_R$ add vectorially to form $V_2$ according to FIG. 2.

Figure 3:
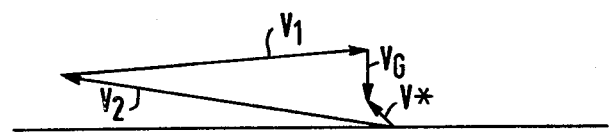

The voltage effective at the filter circuit without the auxiliary and compensation transformers 17 and 18 is composed of the vector sum of $V_1$ and $V_2$, which is different from zero and thereby results in an undesirable harmonic current flow through the line 3. This is prevented by the compensation transformer 18 which generates, by coupling in a supplementary current excitation, a voltage $V_G$ (FIG. 3), which reduces the remaining sum voltage $V^*$ to a small value which can then drive only a negligible residual harmonic current through the consumer arrangement (e.g., the line).

The phase and amplitude of the bucking voltage coupled in via the compensation transformer 18 can be controlled by an auxiliary transformer 17. An interposed control device 21 makes it possible to adjust the degree of compensation automatically or manually by controlling a separate source 19 for the compensation transformer 18. In the simplest form, the output of the transformer 17 may be an input to a meter included in the controlled device 21 which reads the current phase and magnitude and also by means for adjusting the voltage or current from the source 19. An operator could then simply view the meter and adjust the phase and amplitude of the current so as to achieve the desired result.

In this manner, the resultant series voltage of the filter circuit can be compensated to a large extent by the bucking voltage $V_g$, which is impressed in the lengthwise direction.

The sum voltage is $|V^*| \approx |V_L[(\tan \delta \tan \epsilon) - K]|$ with K as a factor which takes the degree of the intended compensation into account.

What is claimed is:

1. A circuit for compensating harmonic currents in a direct current electric supply for a consumer having at least one filter circuit for a harmonic which is connected in parallel to the load and which comprises, in at least one loop, an L-C-R series resonant circuit and a compensation transformer for providing inductively counter-coupled, controller supplementary current excitation and means responsive to the current in the loop for controlling the current in the transducer so as to reduce the harmonic voltage supplied to the consumer to a small value.

2. The circuit of claim 1 further comprising an auxiliary transformer in the loop and a control device for regulating the input to the compensation transformer from an isolated power source, the control device being coupled to the auxiliary transformer and responding to the current in the loop.

* * * * *